(12) United States Patent
Vakil et al.

(10) Patent No.: US 7,043,392 B2
(45) Date of Patent: May 9, 2006

(54) INTERPOLATOR TESTING SYSTEM

(75) Inventors: Kersi H. Vakil, Olympia, WA (US);
Adarsh Panikkar, Tacoma, WA (US);
Abhimanyu Kolla, Tacoma, WA (US);
Arnaud Forestier, Irvine, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/869,573

(22) Filed: Jun. 16, 2004

(65) Prior Publication Data

US 2005/0280452 A1 Dec. 22, 2005

(51) Int. Cl.
*G06F 1/12* (2006.01)

(52) U.S. Cl. .................. 702/125; 713/400; 375/316

(58) Field of Classification Search ................ 702/125; 375/316, 355, 375; 713/400, 500, 503, 600, 713/601
See application file for complete search history.

(56) References Cited

U.S. PATENT DOCUMENTS

| | | | |
|---|---|---|---|
| 6,247,138 B1 * | 6/2001 | Tamura et al. | 713/600 |
| 6,340,909 B1 * | 1/2002 | Zerbe et al. | 327/246 |
| 6,484,268 B1 * | 11/2002 | Tamura et al. | 713/600 |
| 2001/0007136 A1 * | 7/2001 | Tamura et al. | 713/500 |
| 2002/0113637 A1 * | 8/2002 | Huang et al. | 327/258 |
| 2003/0002596 A1 * | 1/2003 | Dunning et al. | 375/316 |
| 2003/0042957 A1 * | 3/2003 | Tamura | 327/233 |
| 2003/0043926 A1 * | 3/2003 | Terashima et al. | 375/257 |
| 2004/0052323 A1 * | 3/2004 | Zhang | 375/375 |
| 2004/0062332 A1 * | 4/2004 | Dabral et al. | 375/373 |
| 2004/0088594 A1 * | 5/2004 | Canagasaby et al. | 713/400 |

* cited by examiner

*Primary Examiner*—Carol S. W. Tsai
(74) *Attorney, Agent, or Firm*—Buckley, Maschoff & Talwalkar LLC

(57) ABSTRACT

According to some embodiments, a device includes an interpolator to receive at least a first clock signal having a first clock phase and to receive a second clock signal having a second clock phase. The interpolator may include a first plurality of interpolator legs associated with the first clock signal, a second plurality of interpolator legs associated with the second clock signal, and an output node to provide an output clock signal having an output clock phase based on the first clock signal, the second clock signal, and on a number of the first plurality and the second plurality of interpolator legs that are activated. The device may also include an interpolator control to activate only one of the first plurality and the second plurality of interpolator legs.

43 Claims, 8 Drawing Sheets

INTERPOLATOR TESTING SYSTEM

BACKGROUND

An interpolator may be used to mix two or more different input signals to provide an output signal. In a transceiver, an interpolator may generate an interpolated clock signal having a desired phase by mixing two or more clock signals. Such an interpolator may be used in conjunction with a tracking loop to extract clock information from a data stream received by the transceiver.

In some examples, an interpolator includes several current legs that are associated with each of the two or more input signals. Several of the current legs draw current at a given time, and the mix of input signals is determined by the number of current-drawing legs associated with each input signal. It is currently difficult to efficiently detect faults in these and other types of interpolators.

DETAILED DESCRIPTION

Figure 1:
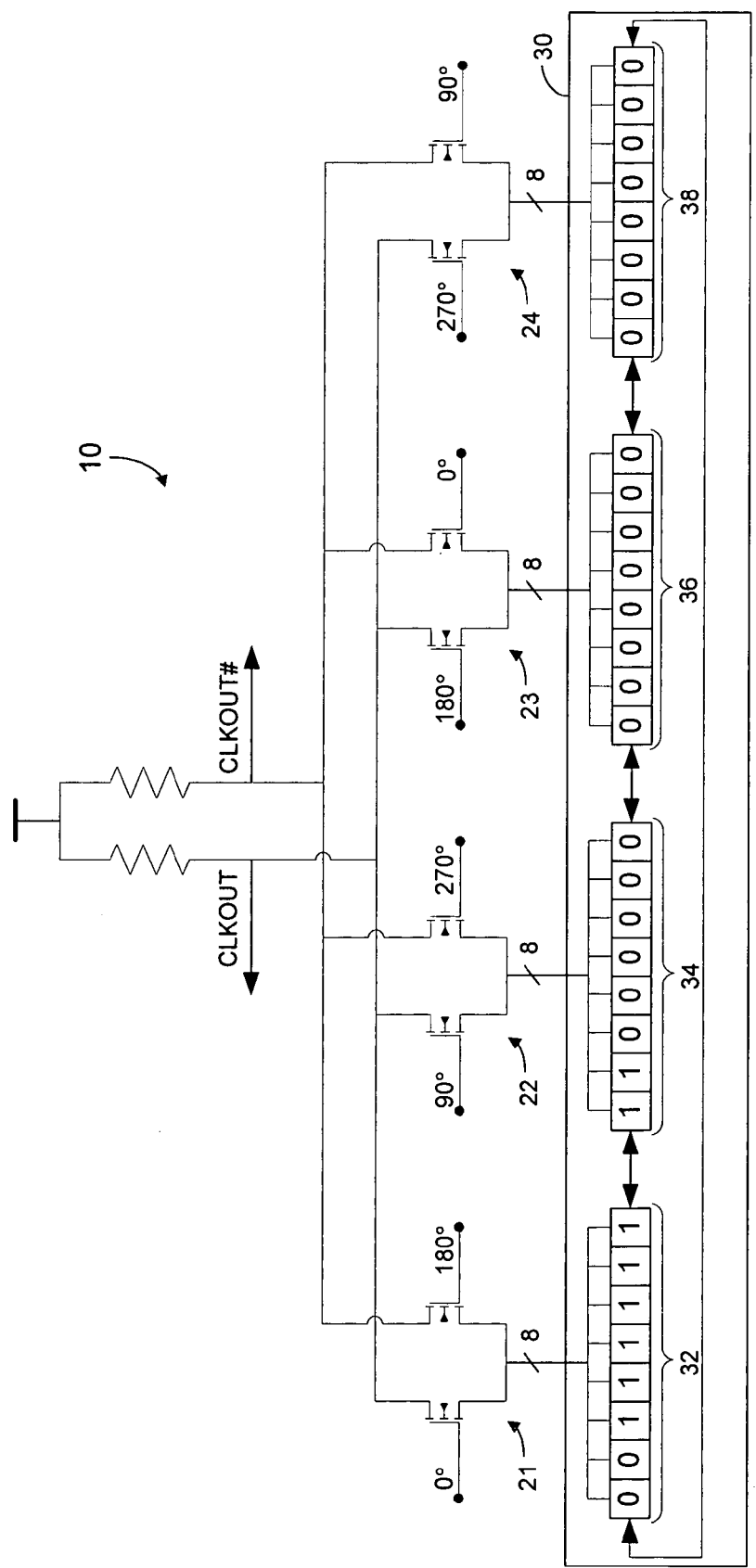
FIG. 1 is a circuit diagram of an interpolator according to some embodiments.

FIG. 1 is a circuit diagram of interpolator 10 according to some embodiments. Interpolator 10 includes pairs 21, 22, 23 and 24 of n-channel metal oxide semiconductor field effect transistors (nMOSFETs) and barrel-shift register 30. Interpolator 10 may operate to receive at least two clock signals having different clock phases and to provide an output clock signal (CLKOUT) having an output clock phase that is based on the at least two received clock signals.

First input terminals of pairs 21, 22, 23 and 24 receive input clock signals with phases 0°, 90°, 180° and 270°, respectively. Second input terminals of pairs 21, 22, 23 and 24 receive input clock signals that are 180° out of phase with the input clock signal received by a respective first input terminal. According to the illustrated example, second input terminals of pairs 21, 22, 23 and 24 receive input clock signals with phases 180°, 270°, 0° and 90°, respectively.

Barrel-shift register 30 comprises thirty-two individual registers. Eight individual registers 32 are coupled to pair 21. Accordingly, eight individual circuits are coupled to pair 21, each of the circuits including a register. Each of these eight circuits shall be referred to herein as an interpolator leg. Each of the eight interpolator legs coupled to pair 21 may be considered to be associated with one or both of the input clock signals received by pair 21. Similarly, eight interpolator legs comprising registers 34, 36 and 38 are coupled to pairs 22, 23, and 24, respectively.

During some conventional interpolator operation, eight legs of interpolator 10 are activated to determine two input clock phases that will be mixed by interpolator 10. FIG. 1 illustrates the activation of six legs associated with pair 21 and two legs associated with pair 22. As shown, a leg may be activated by asserting a bit of a register associated with the leg. In the illustrated example, output clock signal CLKOUT has an output clock phase that is a weighted mix of 0° and 90°. The output clock phase will be closer to 0° than to 90° since more of the activated legs are associated with pair 21 than with pair 22.

The output clock phase may be changed by barrel-shifting the eight asserted bits through register 30. The granularity of the changes is proportional to the period of the input clock signals and inversely proportional to the size of register 30.

Figure 2:
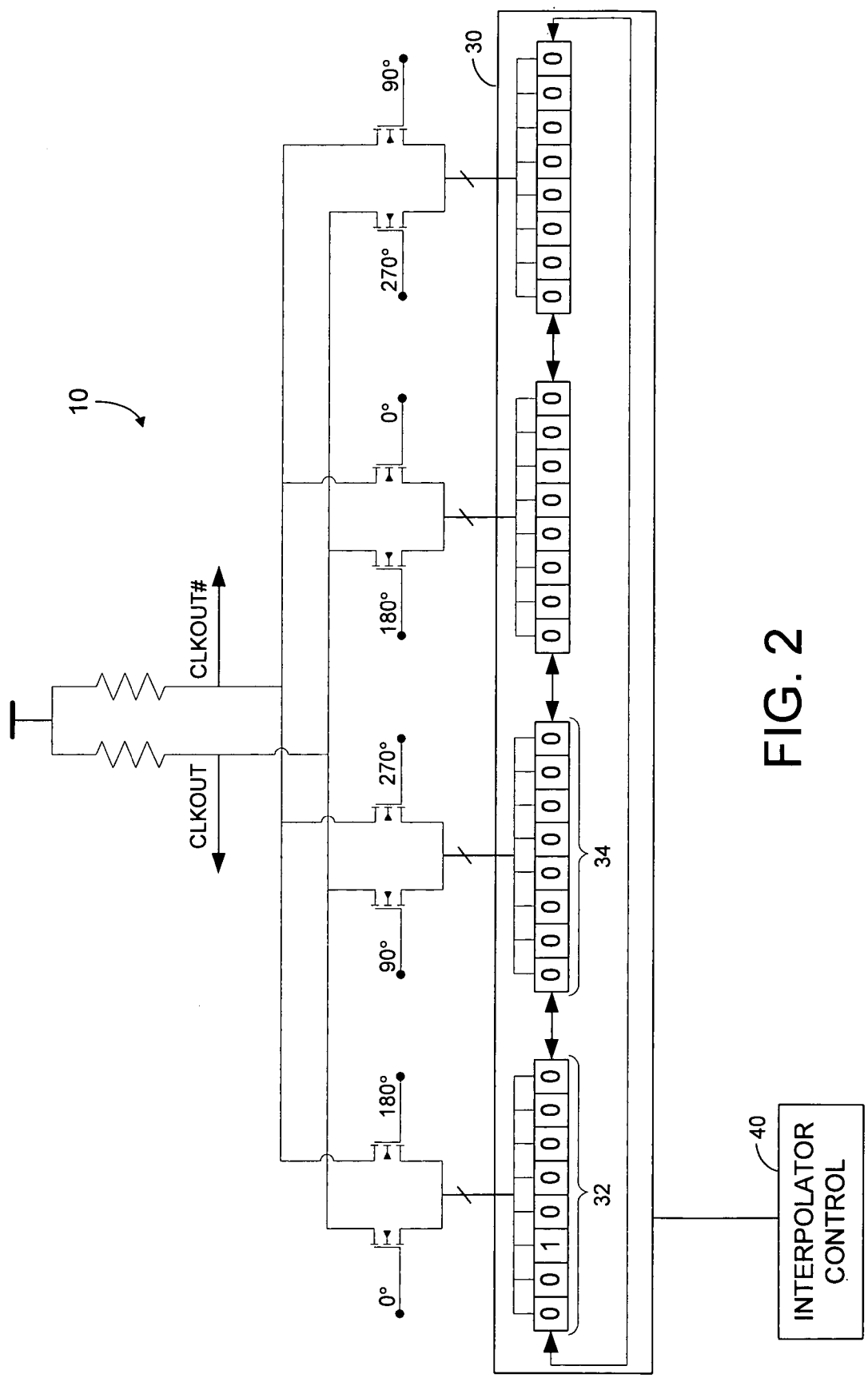
FIG. 2 is a circuit diagram of an interpolator and control logic according to some embodiments.

FIG. 2 is a diagram of interpolator 10 according to some embodiments. FIG. 2 is identical to FIG. 1 except for the inclusion of interpolator control 40 and the assertion of a single bit within register 30. Some embodiments according to FIG. 2 may provide more efficient interpolator leg testing than previously available.

Interpolator control 40 may be used to activate only one of the interpolator legs of interpolator 10. Interpolator control 40 may comprise any currently- or hereafter-known combination of hardware or software. In some embodiments, interpolator control 40 comprises an element conventionally used to barrel-shift asserted bits through register 30. In this regard, register 30 may comprise a barrel-shift register that is selectively operable in the multi-asserted bit mode shown in FIG. 1 or the single asserted bit mode shown in FIG. 2.

Since only one bit of registers 32 is asserted in FIG. 2, the phase of output clock signal CLKOUT is 0°. Interpolator control 40 may operate to barrel-shift the asserted bit toward registers 34. The phase of CLKOUT remains 0° during such shifting until the asserted bit is shifted into one of registers 34. At this point, the phase jumps to 90°.

According to some embodiments, different bias voltages/currents may be applied to elements of interpolator 10 depending on whether interpolator 10 is operating in the mode shown in FIG. 1 or the mode shown in FIG. 2. For example, biases may be adjusted such that the activated leg of FIG. 2 draws substantially the same amount of current as the combined eight activated legs of FIG. 1. Such an adjustment is within the knowledge of those in the art.

Figure 3:
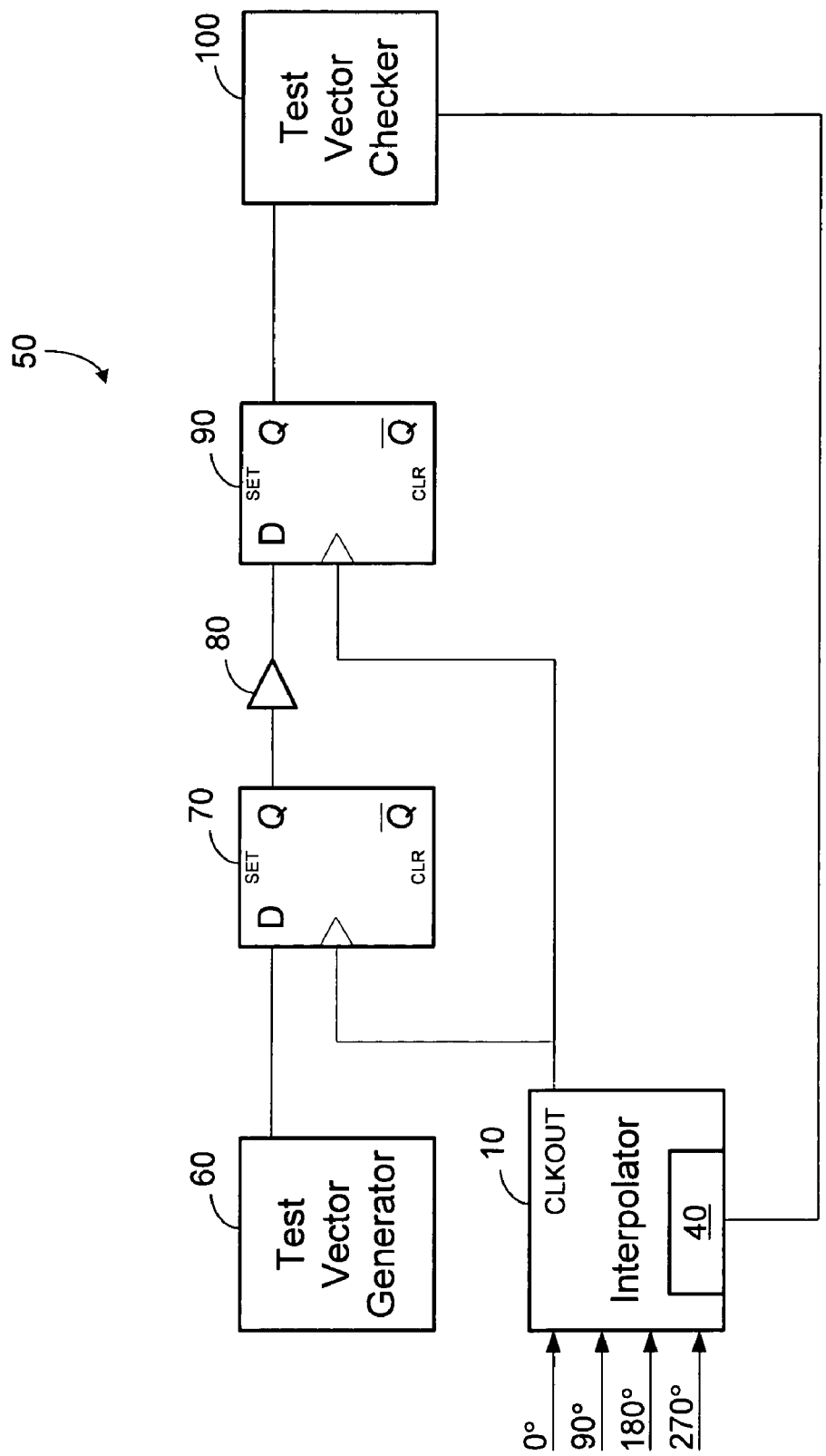
FIG. 3 is a block diagram of a testing device according to some embodiments.

FIG. 3 is a block diagram of testing device 50 according to some embodiments. Testing device 50 comprises interpolator 10, test vector generator 60, flip-flop 70, buffer 80, flip-flop 90, and test vector checker 100. Interpolator control 40 is illustrated as contained within interpolator 10. Interpolator control 40 is an entity separate from interpolator 10 in some embodiments. Testing device 50 may operate to test interpolator 10 for faults.

Generally, interpolator control 40 activates a single leg of interpolator 10 to provide an output clock signal CLKOUT that is based on the activated leg. Test vector generator 60 then transmits test data to flip-flop 70. Flip-flop 70 also receives output clock signal CLKOUT from interpolator 10. Flip-flop 70 therefore provides an output based on the two received signals. Buffer 80 receives the output and provides the output to flip-flop 90. Buffer 80 may be included to avoid a race condition. Flip-flop 90 may also receive output clock signal CLKOUT, and provide a second output based on the two received signals. The second output is received by test vector checker 100, which determines whether the activated leg is functional based on the second output.

If the leg is functional, test vector checker 100 transmits a signal to interpolator control 40 instructing control 40 to activate another single interpolator leg of interpolator 10. Then another single leg may be activated by barrel-shifting the asserted bit. The above process continues until all legs of interpolator 10 are determined to be functional or until one leg is determined to be non-functional. Depending on the desired specifications of interpolator 10, the above process may continue even if two or more legs are determined to be non-functional.

In some embodiments, device 50 resides on a single integrated circuit. Test vector generator 60 and test vector checker 100 may comprise integrated state machines, elements 70 through 90 may comprise test elements, and interpolator 10 may comprise an element of a transceiver. One or more elements of test device 50 may be physically separate from other elements. According to some embodiments, interpolator 10 is an element of an integrated circuit package (e.g., a microprocessor) to be tested, and elements 60 through 100 may comprise hardware and/or software disposed within an external testing device. The external testing device may interface with interpolator 10 (and interpolator control 40) through test pins and/or dedicated pins of the integrated circuit package.

Although flip-flops 70 and 90 are illustrated as D flip-flops, any other flip-flop or latch may be used in conjunction with some embodiments. According to some embodiments, the setup time, hold time and clock-to-output delay of flip-flop 70 are substantially equal to those of flip-flop 90. A period of signal CLKOUT may be greater than a sum of the clock-to-output delay of flip-flop 70, a propagation delay of buffer 80, and the setup time of flip-flop 90. Such an arrangement may provide proper timing of the operation described above.

Figure 4:
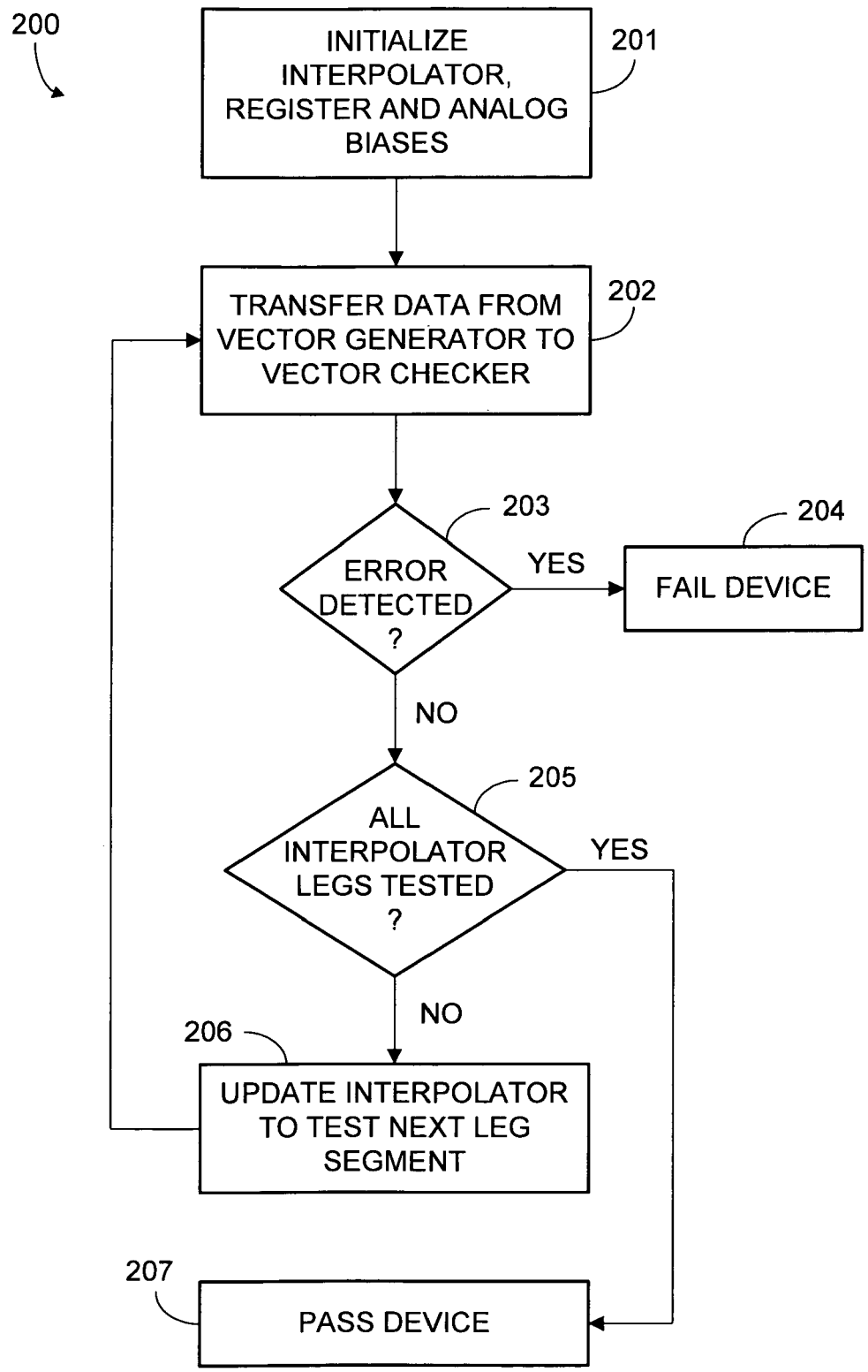
FIG. 4 is a flow diagram of a testing method according to some embodiments.

FIG. 4 is a flow diagram of testing method 200 according to some embodiments. Method 200 may be performed by any suitable combination of hardware and software, and some of method 200 may be performed manually. Method 200 may be used to test interpolator functionality in a high volume manufacturing environment.

Initially, at 201, an interpolator is initialized along with associated registers and analog biases to activate a single leg of the interpolator. The interpolator thereafter provides an output clock signal CLKOUT that is based on the activated leg. Using interpolator 10 of FIG. 2 as an example of 201, interpolator control 40 activates only one leg of interpolator 10 by asserting only one bit of register 30. Biases are applied to elements of interpolator 10 for operation in the mode shown in FIG. 2. These biases may ensure that the activated leg draws substantially a same amount of current as eight activated legs would draw during operation in a non-testing mode. Output signal CLKOUT of the present example has a phase of 0°.

Next, at 202, data is transferred from a test vector generator to a test vector checker. The data transfer may be clocked by the clock signal output by the interpolator. FIG. 3 illustrates some embodiments of 202. In this regard, test vector generator 60 transmits test data to flip-flop 70, which also receives output clock signal CLKOUT from interpolator 10. Flip-flop 70 provides an output to buffer 80, which receives the output and provides the output to flip-flop 90. Flip-flop 90 then provides a second output to test vector checker 100 based on receives output clock signal CLKOUT.

Any errors are detected at 203. According to some embodiments, the transmitted test data will arrive at the test vector checker in a predetermined form and at a predetermined timing if the activated interpolator leg is functional. Therefore, returning to the FIG. 3 example, test vector checker 100 determines whether the output received from flip-flop 90 conforms to the predetermined form and timing. If the output does not conform, an error is detected and the device under test is failed at 204.

If no error is detected at 203, it is determined whether all interpolator legs have been tested at 205. If not, the interpolator is updated to test a next interpolator leg segment. Interpolator control 40 updates interpolator 10 according to some embodiments of 206 by deasserting the asserted bit and asserting a next bit of register 30. This update may be accomplished by barrel-shifting the asserted bit one or more times. As indicated in FIG. 3, test vector checker 100 may issue an instruction to interpolator control at 206 to indicate that no error was detected at 203 and that all interpolator legs were not deemed to have been tested at 205.

Flow returns to 202 from 206 and continues as described above until all interpolator legs are deemed to have been tested at 205. Flow then proceeds to 207 to pass the device under test. According to some implementations, a next device is then tested by re-executing method 200.

Figure 5:
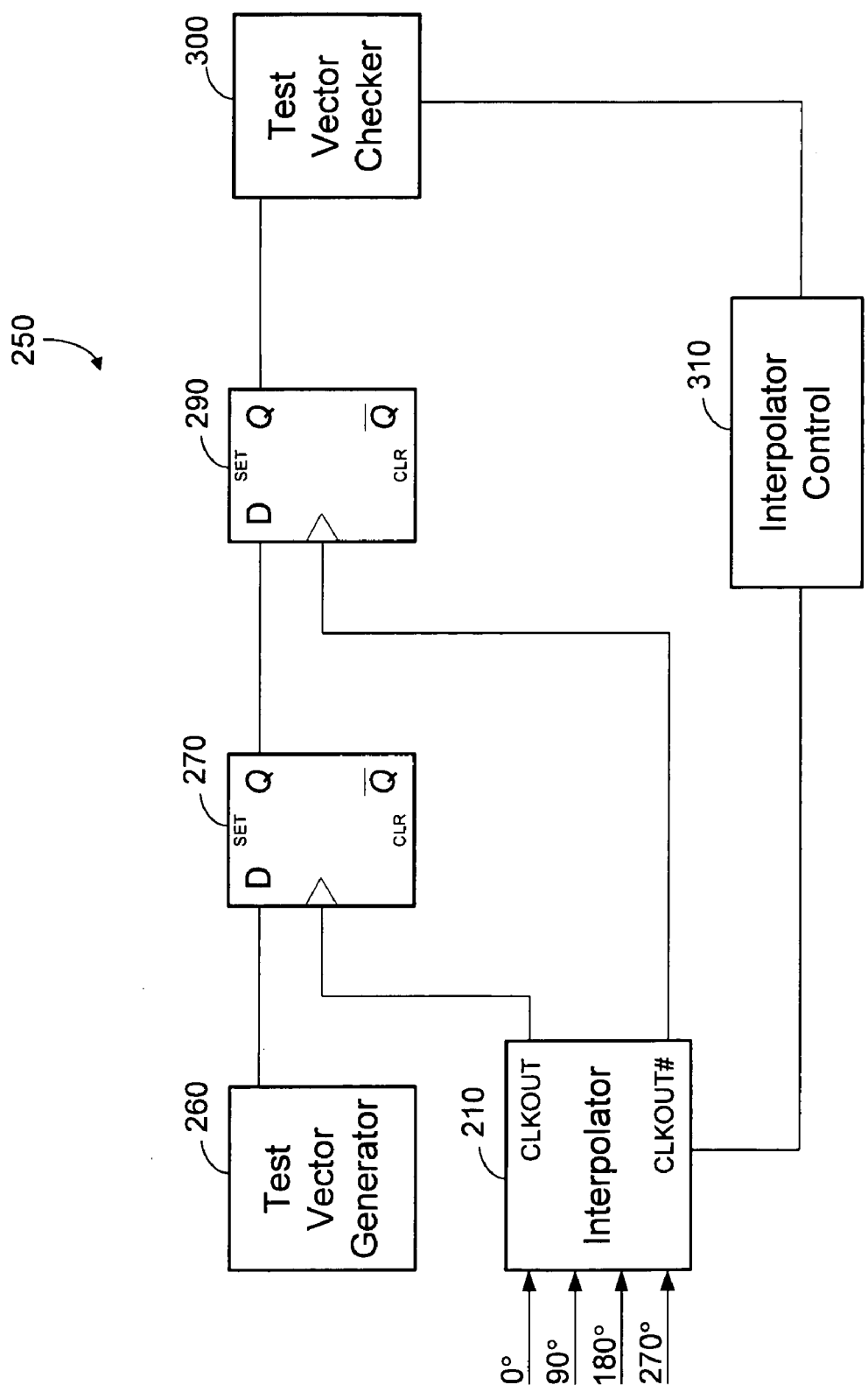
FIG. 5 is a block diagram of a testing device according to some embodiments.

FIG. 5 is a block diagram of testing device 250 according to some embodiments. Testing device 250 includes interpolator 210, test vector generator 260, flip-flop 270, flip-flop 290, test vector checker 300, and interpolator control 310. Testing device 250 may operate to test interpolator 210 for faults, using method 200 or any other suitable method.

Test vector generator 260 and flip-flop 270 may operate as described above with respect to test vector generator 60 and flip-flop 70. More specifically, test vector generator 260 transmits test data to flip-flop 270, which provides an output based on the test data and on output clock signal CLKOUT received from interpolator 210. Flip-flop 290 receives the output and output clock signal CLKOUT# from interpolator 210. Interpolator 210 may be embodied by interpolator 10 of FIG. 1 and FIG. 2, since interpolator 10 generates clock signal CLKOUT and complementary output clock signal CLKOUT#.

Flip-flop 290 provides a second output to test vector checker 300 based on the two received signals. Test vector checker 300 may determine whether the activated interpolator leg is functional based on the second output. Test vector checker 300 may also issue a command to interpolator control 310 to activate only a next leg of interpolator 210. Interpolator control 310 may be located separately from interpolator 210 or may be integrated therewith. In some embodiments, interpolator 210 is an element of an integrated circuit package (e.g., a microprocessor) to be tested, and elements 260 through 310 may comprise hardware and/or software disposed within an external testing device. Each element of device 250 may also reside on a single integrated circuit.

Flip-flops 270 and 290 are illustrated as D flip-flops, but any other flip-flop or latch may be used in conjunction with some embodiments. According to some embodiments, the setup time, hold time and clock-to-output delay of flip-flop 270 are substantially equal to those of flip-flop 290. A period of signal CLKOUT may be greater than twice the sum of the clock-to-output delay of flip-flop 270 and the setup time of flip-flop 290. Such an arrangement may provide proper timing of the operation described above.

Figure 6:
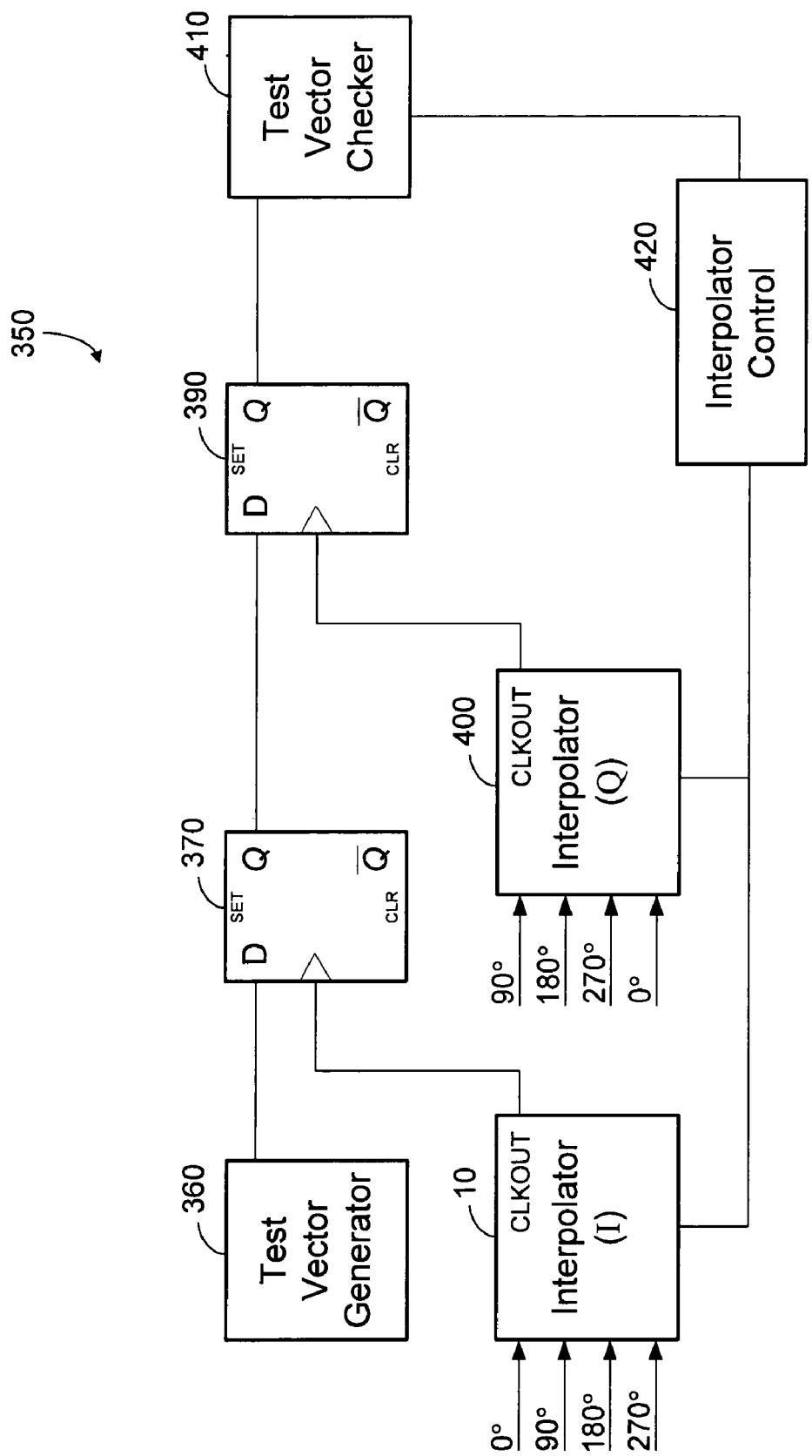
FIG. 6 is a block diagram of a testing device according to some embodiments.

FIG. 6 is a block diagram of testing device 350 according to some embodiments. Testing device 350 includes interpolator 10, test vector generator 360, flip-flop 370, flip-flop 390, interpolator 400, test vector checker 410, and interpolator control 420. Testing device 350 may operate to test interpolator 10 for faults, using method 200 or any other suitable method.

Again, test vector generator 360 and flip-flop 370 may operate as described above with respect to test vector generator 60 and flip-flop 70. Flip-flop 390 receives output from flip-flop 370 and output clock signal CLKOUT from interpolator 400. Interpolator 400 is "in quadrature" with interpolator 10. In other words, a phase of signal CLKOUT from interpolator 400 lags a phase of signal CLKOUT from interpolator 10 by 90°. This relationship may be maintained throughout testing. Two thusly-related interpolators may be used in transceivers that extract embedded clock information from data streams.

Flip-flop 390 provides a second output to test vector checker 410 based on the two received signals. Test vector checker 410 may determine whether the activated interpolator leg is functional based on whether the second output conforms to expected timings and values. If the leg is functional, test vector checker 410 may also issue a command to interpolator control 420 to activate only a next leg of interpolator 10 and of interpolator 400. Such activation may change a phase of each output clock signal, but may maintain a 90° phase lag therebetween.

Interpolator control 420 may be located separately from interpolator 10 and interpolator 400 or may be integrated with one or both. Device 350 may comprise a dedicated interpolator control for each of interpolator 10 and interpolator 400.

Flip-flops 370 and 390 are illustrated as D flip-flops, but any other flip-flop or latch may be used in conjunction with some embodiments. The setup time, hold time and clock-to-output delay of flip-flop 370 may be substantially equal to those of flip-flop 390. For proper timing, a period of the clock signals CLKOUT may be greater than four times a sum of the clock-to-output delay of flip-flop 370 and the setup time of flip-flop 390.

Each element of device 350 may reside on a single integrated circuit. Test vector generator 360 and test vector checker 410 may comprise integrated state machines, elements 370 and 390 may comprise test elements, and interpolators 10 and 400 may comprise an element of a transceiver. One or more elements of test device 350 may be physically separate from other elements. According to some embodiments, interpolators 10 and 400 are elements of an integrated circuit package (e.g., a microprocessor) to be tested, and the other elements of device 350 may comprise hardware and/or software disposed within an external testing device.

Figure 7:
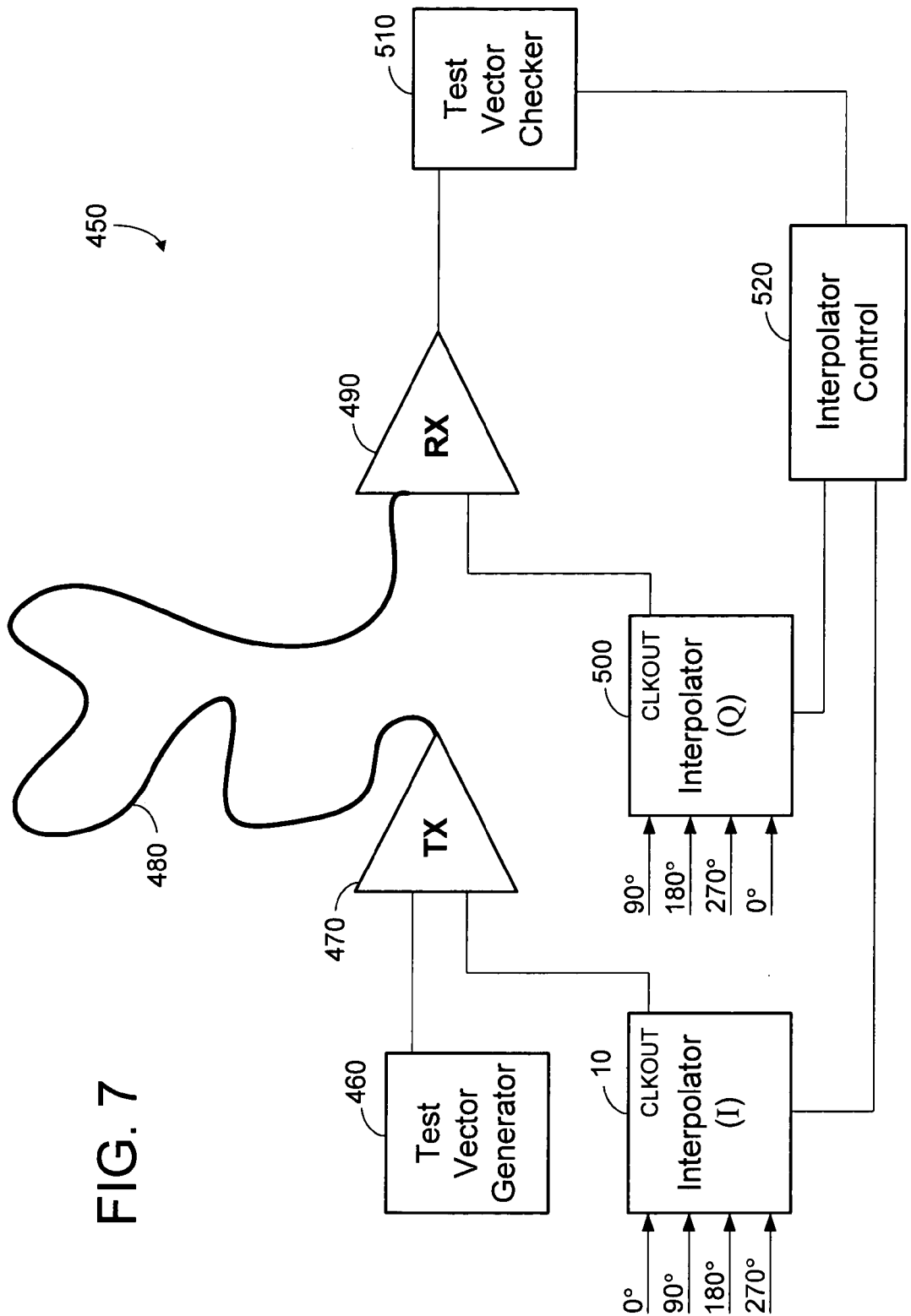
FIG. 7 is a block diagram of a testing device according to some embodiments.

FIG. 7 is a block diagram of testing device 450 according to some embodiments. Testing device 450 includes interpolator 10, test vector generator 460, transmitter 470, trace 480, receiver 490, interpolator 500, test vector checker 510, and interpolator control 520. Testing device 450 may also operate to test interpolator 10 for faults, using method 200 or any other suitable method.

Test vector generator 460 and transmitter 470 may operate as described above with respect to test vector generator 60 and flip-flop 70. Transmitter 470 transmits the clocked data over trace 480 to receiver 490, which also receives output clock signal CLKOUT from interpolator 500. Interpolator 500 is in quadrature with interpolator 10 as described above.

Receiver 490 provides clocked data to test vector checker 510 based on the two received signals. Test vector checker 510 determines whether the activated leg of interpolator 10 is functional based on whether the clocked data conforms to expected timings and values. If the leg is functional, test vector checker 510 may also issue a command to interpolator control 520 to activate only a next leg of interpolator 10 and of interpolator 500. Again, such activation may change a phase of each output clock signal, but may maintain a 90° phase lag therebetween.

Interpolator control 520 may be located separately from interpolator 10 and interpolator 500 or may be integrated with one or both. Device 450 may comprise a dedicated interpolator control for each of interpolator 10 and interpolator 500. Interpolator control may transmit different control signals to interpolators 10 and 500 according to the illustrated embodiment.

Transmitter 470 and receiver 490 may be elements of a single transceiver and trace 480 may comprise a signal line that is external to the transceiver. For proper timing, a period of the clock signals CLKOUT may be greater than four times the sum of a transmitter delay of transmitter 470, a propagation delay due to trace 480, and a setup delay of receiver 490.

The elements of device 450 may reside on a single integrated circuit. Test vector generator 460 and test vector checker 510 may comprise integrated state machines, and the other elements may comprise elements of a transceiver. Test vector generator 460 and test vector checker 510 may also or alternatively comprise hardware and/or software disposed within an external testing device. One or more elements of test device 450 may be physically separate from other elements.

Figure 8:
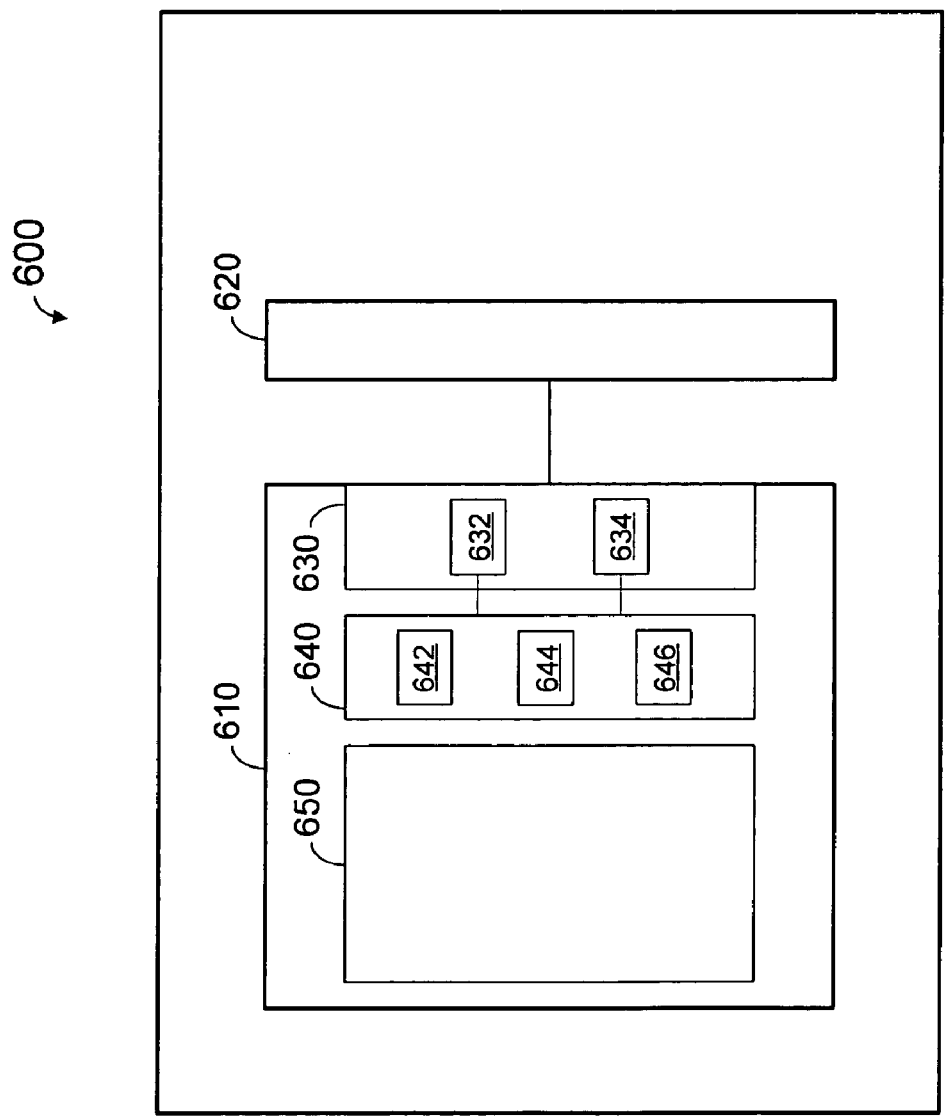
FIG. 8 is a block diagram of a system according to some embodiments.

FIG. 8 is a block diagram of system 600 according to some embodiments. System 600 may comprise a motherboard. System 600 includes integrated circuit 610, which may comprise a microprocessor. Microprocessor 610 is coupled to memory 620, which may comprise any type of memory for storing data, such as a Synchronous Dynamic Random Access Memory, a Double Data Rate Random Access Memory, a fully buffered Dual In-line Memory Module, or a Programmable Read Only Memory.

Microprocessor 610 includes transceiver 630 having interpolators 632 and 634. Transceiver 630 may provide serial I/O functions, including but not limited to direct memory access. Interpolators 632 and 634 of transceiver 630 may be in quadrature with one another. Testing unit 640 may be used to test interpolators 632 and 634 as described herein. Accordingly, testing unit 640 comprises test vector generator 642, test vector checker 644, and interpolator control 646. Microprocessor 610 also includes core 650 for providing primary functions of microprocessor 610.

The several embodiments described herein are solely for the purpose of illustration. Some embodiments may incorporate, in part or in whole, any currently or hereafter-known interpolators, flip-flops, transmitters, receivers, and other elements. Therefore, persons in the art will recognize from this description that other embodiments may be practiced with various modifications and alterations.

What is claimed is:

1. A device comprising:
   an interpolator to receive at least a first clock signal having a first clock phase and to receive a second clock signal having a second clock phase, the interpolator comprising:
   a first plurality of interpolator legs associated with the first clock signal;
   a second plurality of interpolator legs associated with the second clock signal; and
   an output node to provide an output clock signal having an output clock phase based on the first clock signal, the second clock signal, and on a number of the first plurality and the second plurality of interpolator legs that are activated; and an interpolator control to activate only one of the first plurality and the second plurality of interpolator legs.

2. A device according to claim 1, further comprising:
a test vector generator to transmit test data;
a first flip-flop to receive the test data from the test vector generator, to receive the output clock signal from the interpolator, and to provide a first flip-flop output based on the test data and the output clock signal;
a second flip-flop to receive the first flip-flop output, to receive the output clock signal from the interpolator, and to provide a second flip-flop output based on the first flip-flop output and the output clock signal; and
a test vector checker to receive the second flip-flop output, and to determine whether the one of the first plurality and the second plurality of interpolator legs is functional based on the second flip-flop output.

3. A device according to claim 2, further comprising:
a buffer to receive the first flip-flop output and to provide the first flip-flop output to the second flip-flop.

4. A device according to claim 3, wherein a period of the output clock signal is greater than a sum of a clock-to-output delay of the first flip-flop, a propagation delay of the buffer, and a setup time of the second flip-flop.

5. A device according to claim 2, wherein a period of the output clock signal is greater than a sum of a clock-to-output delay of the first flip-flop, and a setup time of the second flip-flop.

6. A device according to claim 2, the test vector checker to instruct the interpolator control to activate only another one of the first plurality and the second plurality of interpolator legs.

7. A device according to claim 1, the interpolator further comprising a second output node to provide a complementary output clock signal, the complementary output clock signal being complementary to the output clock signal, and the device further comprising:
a test vector generator to transmit test data;
a first flip-flop to receive the test data from the test vector generator, to receive the output clock signal from the interpolator, and to provide a first flip-flop output based on the test data and the output clock signal;
a second flip-flop to receive the first flip-flop output, to receive the complementary output clock signal from the interpolator, and to provide a second flip-flop output based on the first flip-flop output and the complementary output clock signal; and
a test vector checker to receive the second flip-flop output, and to determine whether the one of the first plurality and the second plurality of interpolator legs is functional based on the second flip-flop output.

8. A device according to claim 7, wherein a period of the output clock signal is greater than twice a sum of a clock-to-output delay of the first flip-flop and a setup time of the second flip-flop.

9. A device according to claim 7, the test vector checker to instruct the interpolator control to activate only another one of the first plurality and the second plurality of interpolator legs.

10. A device according to claim 1, further comprising:
a test vector generator to transmit test data;
a first flip-flop to receive the test data from the test vector generator, to receive the output clock signal from the interpolator, and to provide a first flip-flop output based on the test data and the output clock signal;
a second interpolator to provide a second output clock signal having a second output clock phase, the second output clock phase lagging the output clock phase by substantially ninety degrees;
a second flip-flop to receive the first flip-flop output, to receive the second output clock signal from the second interpolator, and to provide a second flip-flop output based on the first flip-flop output and the second output clock signal; and
a test vector checker to receive the second flip-flop output, and to determine whether the one of the first plurality and the second plurality of interpolator legs is functional based on the second flip-flop output.

11. A device according to claim 10, wherein a period of the output clock signal is greater than four times a sum of a clock-to-output delay of the first flip-flop and a setup time of the second flip-flop.

12. A device according to claim 10, the test vector checker to instruct the interpolator control to activate only another one of the first plurality and the second plurality of interpolator legs.

13. A device according to claim 1, further comprising:
a test vector generator to transmit test data;
a transmitter to receive the test data from the test vector generator, to receive the output clock signal from the interpolator, and to transmit an output signal based on the test data and the output clock signal;
a second interpolator to provide a second output clock signal having a second output clock phase, the second output clock phase lagging the output clock phase by substantially ninety degrees;
a receiver to receive the output signal, to receive the second output clock signal from the second interpolator, and to provide a second output signal based on the output signal and the second output clock signal; and
a test vector checker to receive the second output signal, and to determine whether the one of the first plurality and the second plurality of interpolator legs is functional based on the second output signal.

14. A device according to claim 13, wherein a period of the output clock signal is greater than four times a sum of a transmitter delay of the transmitter, a propagation delay between the transmitter and the receiver, and a setup delay of the receiver.

15. A device according to claim 13, the test vector checker to instruct the interpolator control to activate only another one of the first plurality and the second plurality of interpolator legs.

16. A device according to claim 13, wherein the transmitter and the receiver are elements of a transceiver.

17. A device according to claim 16, further comprising a loop-back trace to carry the output signal between the transmitter and the receiver.

18. A method comprising:
receiving at least a first clock signal having a first clock phase and a second clock signal having a second clock phase;
activating only one of a first plurality of interpolator legs associated with the first clock signal and a second plurality of interpolator legs associated with the second clock signal; and
providing an output clock signal having an output clock phase based on the first clock signal, the second clock signal, and on the one activated interpolator leg.

19. A method according to claim 18, further comprising:
activating only another one of the first plurality and the second plurality of interpolator legs; and providing a second output clock signal having a second output clock phase based on the first clock signal, the second clock signal, and on the one another activated interpolator leg.

20. A method according to claim 18, further comprising:
   transmitting test data to a first flip-flop;
   receiving the test data and the output clock signal at the first flip-flop;
   providing a first flip-flop output based on the test data and the output clock signal;
   receiving the first flip-flop output and the output clock signal at a second flip-flop;
   providing a second flip-flop output based on the first flip-flop output and the output clock signal;
   receiving the second flip-flop output; and
   determining whether the one activated interpolator leg is functional based on the second flip-flop output.

21. A method according to claim 20, further comprising:
   receiving the first flip-flop output at a buffer; and
   transmitting the first flip-flop output from the buffer to the second flip-flop.

22. A method according to claim 21, wherein a period of the output clock signal is greater than a sum of a clock-to-output delay of the first flip-flop, a propagation delay of the buffer, and a setup time of the second flip-flop.

23. A method according to claim 21, wherein a period of the output clock signal is greater than a sum of a clock-to-output delay of the first flip-flop, and a setup time of the second flip-flop.

24. A method according to claim 21, further comprising:
   if the one activated interpolator leg is functional, activating only another one of the first plurality and the second plurality of interpolator legs.

25. A method according to claim 18, further comprising:
   providing a complementary output clock signal, the complementary output clock signal being complementary to the output clock signal;
   transmitting test data to a first flip-flop;
   receiving the test data and the output clock signal at the first flip-flop;
   providing a first flip-flop output based on the test data and the output clock signal;
   receiving the first flip-flop output and the complementary output clock signal at a second flip-flop;
   providing a second flip-flop output based on the first flip-flop output and the complementary output clock signal;
   receiving the second flip-flop output; and
   determining whether the one activated interpolator leg is functional based on the second flip-flop output.

26. A method according to claim 25, wherein a period of the output clock signal is greater than twice a sum of a clock-to-output delay of the first flip-flop and a setup time of the second flip-flop.

27. A method according to claim 25, further comprising:
   if the one activated interpolator leg is functional, activating only another one of the first plurality and the second plurality of interpolator legs.

28. A method according to claim 18, further comprising:
   transmitting test data to a first flip-flop;
   receiving the test data and the output clock signal at the first flip-flop;
   providing a first flip-flop output based on the test data and the output clock signal;
   providing a second output clock signal having a second output clock phase, the second output clock phase lagging the output clock phase by substantially ninety degrees;
   receiving the first flip-flop output and the second output clock signal at a second flip-flop;
   providing a second flip-flop output based on the first flip-flop output and the second output clock signal;
   receiving the second flip-flop output; and
   determining whether the one activated interpolator leg is functional based on the second flip-flop output.

29. A method according to claim 28, wherein a period of the output clock signal is greater than four times a sum of a clock-to-output delay of the first flip-flop and a setup time of the second flip-flop.

30. A method according to claim 28, further comprising:
   if the one activated interpolator leg is functional, activating only another one of the first plurality and the second plurality of interpolator legs.

31. A method according to claim 18, further comprising:
   transmitting test data to a transmitter;
   receiving the test data and the output clock signal at the transmitter;
   providing an output signal based on the test data and the output clock signal;
   providing a second output clock signal having a second output clock phase, the second output clock phase lagging the output clock phase by substantially ninety degrees;
   receiving the output signal and the second output clock signal at a receiver;
   providing a second output signal based on the output signal and the second output clock signal;
   receiving the second output signal; and
   determining whether the one activated interpolator leg is functional based on the second output signal.

32. A method according to claim 31, wherein a period of the output clock signal is greater than four times a sum of a transmitter delay of the transmitter, a propagation delay between the transmitter and the receiver, and a setup delay of the receiver.

33. A method according to claim 31, further comprising:
   if the one activated interpolator leg is functional, activating only another one of the first plurality and the second plurality of interpolator legs.

34. A system comprising:
   a microprocessor comprising a transceiver, the transceiver comprising:
      an interpolator to receive at least a first clock signal having a first clock phase and to receive a second clock signal having a second clock phase; the interpolator comprising:
         a first plurality of interpolator legs associated with the first clock signal;
         a second plurality of interpolator legs associated with the second clock signal; and
         an output node to provide an output clock signal having an output clock phase based on the first clock signal, the second clock signal, and on a number of the first plurality and the second plurality of interpolator legs that are activated; and
      an interpolator control to activate only one of the first plurality and the second plurality of interpolator legs; and
   a fully-buffered dual in-line memory module coupled to the microprocessor.

35. A system according to claim 34, the microprocessor further comprising:
  a test vector generator to transmit test data;
  a first flip-flop to receive the test data from the test vector generator, to receive the output clock signal from the interpolator, and to provide a first flip-flop output based on the test data and the output clock signal;
  a second flip-flop to receive the first flip-flop output, to receive the output clock signal from the interpolator, and to provide a second flip-flop output based on the first flip-flop output and the output clock signal; and
  a test vector checker to receive the second flip-flop output, and to determine whether the one of the first plurality and the second plurality of interpolator legs is functional based on the second flip-flop output.

36. A system according to claim 35, the test vector checker to instruct the interpolator control to activate only another one of the first plurality and the second plurality of interpolator legs.

37. A system according to claim 34, the interpolator further comprising a second output node to provide a complementary output clock signal, the complementary output clock signal being complementary to the output clock signal, and the microprocessor further comprising:
  a test vector generator to transmit test data;
  a first flip-flop to receive the test data from the test vector generator, to receive the output clock signal from the interpolator, and to provide a first flip-flop output based on the test data and the output clock signal;
  a second flip-flop to receive the first flip-flop output, to receive the complementary output clock signal from the interpolator, and to provide a second flip-flop output based on the first flip-flop output and the complementary output clock signal; and
  a test vector checker to receive the second flip-flop output, and to determine whether the one of the first plurality and the second plurality of interpolator legs is functional based on the second flip-flop output.

38. A system according to claim 37, the test vector checker to instruct the interpolator control to activate only another one of the first plurality and the second plurality of interpolator legs.

39. A system according to claim 34, the microprocessor further comprising:
  a test vector generator to transmit test data;
  a first flip-flop to receive the test data from the test vector generator, to receive the output clock signal from the interpolator, and to provide a first flip-flop output based on the test data and the output clock signal;
  a second interpolator to provide a second output clock signal having a second output clock phase, the second output clock phase lagging the output clock phase by substantially ninety degrees;
  a second flip-flop to receive the first flip-flop output, to receive the second output clock signal from the second interpolator, and to provide a second flip-flop output based on the first flip-flop output and the second output clock signal; and
  a test vector checker to receive the second flip-flop output, and to determine whether the one of the first plurality and the second plurality of interpolator legs is functional based on the second flip-flop output.

40. A system according to claim 39, the test vector checker to instruct the interpolator control to activate only another one of the first plurality and the second plurality of interpolator legs.

41. A system according to claim 34, the microprocessor further comprising:
  a test vector generator to transmit test data;
  a transmitter to receive the test data from the test vector generator, to receive the output clock signal from the interpolator, and to transmit an output signal based on the test data and the output clock signal;
  a second interpolator to provide a second output clock signal having a second output clock phase, the second output clock phase lagging the output clock phase by substantially ninety degrees;
  a receiver to receive the output signal, to receive the second output clock signal from the second interpolator, and to provide a second output signal based on the output signal and the second output clock signal; and
  a test vector checker to receive the second output signal, and to determine whether the one of the first plurality and the second plurality of interpolator legs is functional based on the second output signal.

42. A system according to claim 41, the test vector checker to instruct the interpolator control to activate only another one of the first plurality and the second plurality of interpolator legs.

43. A system according to claim 41, wherein the transmitter and the receiver are elements of the transceiver.

* * * * *